US010236879B2

(12) United States Patent
Guo

(10) Patent No.: US 10,236,879 B2
(45) Date of Patent: Mar. 19, 2019

(54) THYRISTOR DRIVING APPARATUS

(71) Applicants: GUANGZHOU KINGSER ELECTRONICS CO., LTD, Guangzhou, Guangdong (CN); Qiaoshi Guo, Guangzhou, Guangdong (CN)

(72) Inventor: Qiaoshi Guo, Guangzhou (CN)

(73) Assignees: Qiaoshi Guo, Guangzhou, Guangdong (CN); GUANGZHOU KINGSER ELECTRONICS CO., LTD, Guangzhou, Guangdong (CN)

( * ) Notice: Subject to any disclaimer, the term of this patent is extended or adjusted under 35 U.S.C. 154(b) by 0 days.

(21) Appl. No.: 15/686,767

(22) Filed: Aug. 25, 2017

(65) Prior Publication Data

US 2017/0353180 A1    Dec. 7, 2017

Related U.S. Application Data

(63) Continuation of application No. PCT/CN2016/074669, filed on Feb. 26, 2016.

(30) Foreign Application Priority Data

Feb. 27, 2015  (CN) .......................... 2015 1 0095404
Mar. 2, 2015  (CN) .......................... 2015 1 0107976
(Continued)

(51) Int. Cl.
    *H03K 17/725*    (2006.01)
    *H03K 17/30*    (2006.01)

(52) U.S. Cl.
    CPC ..... *H03K 17/725* (2013.01); *H03K 2017/307* (2013.01)

(58) Field of Classification Search
    CPC .................................................... H03K 17/725
    See application file for complete search history.

(56) References Cited

U.S. PATENT DOCUMENTS 4,358,729 A * 11/1982 Hart .......................... H05B 6/68
                                                            323/241

FOREIGN PATENT DOCUMENTS

| CN | 202435365 U | 9/2012 |
| CN | 203103969 U | 7/2013 |

(Continued)

OTHER PUBLICATIONS

State Intellectual Property Office of the P.R. China (ISR/CN), "International Search Report for PCT/CN2016/074669", China, dated May 27, 2016.

*Primary Examiner* — Daniel Puentes
(74) *Attorney, Agent, or Firm* — Tim Tingkang Xia, Esq.; Locke Lord LLP

(57) ABSTRACT

An apparatus for driving a thyristor in an alternating-current power grid includes a non-isolated power supply circuit and a throttling circuit. One terminal of a power supply input of the non-isolated power supply circuit is connected to a first terminal of the thyristor. The other terminal of the power supply input is connected to another phase of the power supply relative to the first terminal or a neutral lead. The non-isolated power supply circuit forms a signal trigger loop through the throttling circuit, a second terminal of the thyristor and the first terminal of the thyristor. A control terminal of the throttling circuit is connected to a third terminal of the thyristor. The apparatus of the present invention has advantages of occupying a small space and having a simple circuit, a great instantaneous triggering current, a high cost effectiveness, and a low power consumption.

29 Claims, 2 Drawing Sheets

(30) Foreign Application Priority Data

Oct. 21, 2015 (CN) .......................... 2015 1 0715771
Jan. 24, 2016 (CN) .......................... 2016 1 0070145
Jan. 24, 2016 (CN) .......................... 2016 1 0071552

(56) References Cited

FOREIGN PATENT DOCUMENTS

| | | |
|---|---|---|
| CN | 203340038 U | 12/2013 |
| JP | 2001217702 A | 8/2001 |
| JP | 2007174577 A | 7/2007 |

* cited by examiner

THYRISTOR DRIVING APPARATUS

CROSS-REFERENCE TO RELATED APPLICATIONS

This application is a continuation application of International Patent Application No. PCT/CN2016/074669, filed Feb. 26, 2016, which itself claims priority to and benefit of Chinese Patent Application No. 201510095404.8, filed Feb. 27, 2015, Chinese Patent Application No. 201510107976.3, filed Mar. 2, 2015, Chinese Patent Application No. 201510715771.3, filed Oct. 21, 2015, and Chinese Patent Application Nos. 201610070145.8 and 201610071552.0, both filed Jan. 24, 2016, in the State Intellectual Property Office of P.R. China, which are hereby incorporated herein in their entireties by reference.

TECHNICAL FIELD

The present invention relates general to the field of electrics, and more particularly, to an apparatus for driving a thyristor in an alternating-current (AC) power grid.

BACKGROUND

Currently, applications of thyristors in an alternating-current power grid to control electric capacitors, motors, and heating elements become more popular, where a thyristor driving apparatus for the thyristors is driven by transformers in an isolated manner or driven by high-voltage electronic switches, which has the following disadvantages:

1. Driven by a transformer in an isolated manner: A thyristor driving signal is provided by a transformer. A pulse signal generating circuit, a transformer driving circuit, the transformer, and a rectifier circuit are needed. There are disadvantages such as high-frequency pollution, a large occupied space, and a low cost-effectiveness.

2. Driven by a high-voltage electronic switch: A thyristor driving signal is sent from a main loop of a thyristor, via a resistor and a high-voltage electronic switch (for example, a high-voltage photoelectric coupler such as MOC3083), to a trigger electrode of the thyristor. The high-voltage electronic switch withstands a relatively high voltage, and a plurality of high-voltage electronic switched is needed for being connected in series for use in a 380V system, which has disadvantages of having poor reliability and being easy to breakdown.

SUMMARY

One of the objectives of the present invention is to provide a thyristor driving apparatus that does not need to be triggered by a transformer, does not need a high-voltage electronic switch, occupies a small space, and has a simple circuit, a great instantaneous triggering current, a high cost effectiveness, and a low power consumption with respect to the disadvantages of the existing thyristor driving apparatuses.

The objective of the present invention is implemented through the following technical solutions:

A thyristor driving apparatus includes a non-isolated power supply circuit and a throttling circuit, where one terminal of a power supply input of the non-isolated power supply circuit is connected to a first terminal of a thyristor to be driven; the other terminal of the power supply input is connected to another phase of power supply relative to the first terminal or a neutral lead; the non-isolated power supply circuit forms a signal trigger loop through the throttling circuit, a second terminal of the thyristor, and the first terminal; and a control terminal of the throttling circuit is connected to a third terminal of the thyristor.

In one embodiment of the thyristor driving apparatus, when the throttling circuit detects that a potential difference between the third terminal and the first terminal is greater than a voltage drop of which the thyristor is turned on, a trigger signal of the thyristor is applied, and when the throttling circuit detects that the thyristor is turned on, the trigger signal is shut off.

In one embodiment of the thyristor driving apparatus, the throttling circuit comprises at least a semiconductor device, and at least a current-limited element.

In one embodiment of the thyristor driving apparatus, the non-isolated power supply circuit includes a current-limiting element, a unidirectional device, a capacitor, and a voltage regulator device; the current-limiting element, the unidirectional device, and the capacitor are connected in series to form a first series circuit; one terminal of the first series circuit is connected to the first terminal; the other terminal of the first series circuit is connected to another phase of power supply or the neutral lead; and the capacitor is connected in parallel to the voltage regulator device, or the capacitor is connected in series to the unidirectional device to form a series circuit that is connected in parallel to the voltage regulator device.

In one embodiment of the thyristor driving apparatus, a current of the current-limiting element is smaller than a minimum trigger current needed for triggering the thyristor to be turned on.

In one embodiment of the thyristor driving apparatus, the voltage regulator device is a voltage regulator diode; the unidirectional device is a diode; and the current-limiting element is a resistor.

The thyristor driving apparatus further includes a fourth resistor, where the fourth resistor is connected in series in a discharge loop of the capacitor.

In one embodiment of the thyristor driving apparatus, the capacitor forms a discharge loop through the throttling circuit, the second terminal, and the first terminal.

In one embodiment of the thyristor driving apparatus, the thyristor is a unidirectional thyristor; the first terminal is a cathode of the unidirectional thyristor; the second terminal is a trigger electrode of the unidirectional thyristor; the third terminal is an anode of the unidirectional thyristor; the throttling circuit includes a second resistor and a first semiconductor switch; a control terminal of the first semiconductor switch is connected, through the second resistor, to the anode of the unidirectional thyristor; and the capacitor forms a discharge loop through the first semiconductor switch, the trigger electrode, and the cathode.

In one embodiment of the thyristor driving apparatus, when the throttling circuit detects that a forward potential difference between the anode of the unidirectional thyristor and the cathode of the unidirectional thyristor is greater than a voltage drop of which the unidirectional thyristor is turned on, the first semiconductor switch is turned on, and when the throttling circuit detects that the unidirectional thyristor is turned on, the first semiconductor switch is turned off.

In one embodiment of the thyristor driving apparatus, the first semiconductor switch is an NPN-type transistor, an NPN-type Darlington transistor, or an NPN-type Darlington circuit.

The thyristor driving apparatus further includes a third resistor, where a collector electrode of the transistor is used as an input for a trigger signal of the unidirectional thyristor;

an emitter electrode of the transistor is connected to the trigger electrode; a base electrode of the transistor is connected to the second resistor; and two terminals of the third resistor are respectively connected to the emitter electrode of the transistor and the base electrode of the transistor.

In one embodiment of the thyristor driving apparatus, the current-limiting element is connected to the unidirectional device; another phase of the power supply or the neutral lead forwardly charges the capacitor via the current-limiting element and the unidirectional device; a forward charging terminal of the capacitor is connected, via the first semiconductor switch, to the trigger electrode; and the other terminal of the capacitor is connected to the cathode of the unidirectional thyristor.

The thyristor driving apparatus further includes a second semiconductor switch used to control discharging of the capacitor.

In one embodiment of the thyristor driving apparatus, the second semiconductor switch is a photoelectric coupler or a photocoupling driving transistor circuit.

In one embodiment of the thyristor driving apparatus, a cathode of the unidirectional device is connected to a forward charging terminal of the capacitor; an anode of the unidirectional device is connected to the cathode of the unidirectional thyristor; one terminal of the current-limiting element is connected to the other terminal of the capacitor; the other terminal of the current-limiting element is connected to another phase of power supply or the neutral lead; the forward charging terminal of the capacitor is connected, via the first semiconductor switch, to the trigger electrode; and the capacitor is connected in series to the unidirectional device to form a series circuit that is connected in parallel to an output of the second semiconductor switch.

In one embodiment of the thyristor driving apparatus, an output of the second semiconductor switch is connected to the control terminal of the first semiconductor switch.

The thyristor driving apparatus further includes a second voltage regulator diode, where the second resistor is connected, via the output of the second semiconductor switch, to the control terminal of the first semiconductor switch; an anode of the second voltage regulator diode is connected to the cathode of the unidirectional thyristor; and a common terminal of connection between the second resistor and the second semiconductor switch is connected to a cathode of the second voltage regulator diode.

In one embodiment of the thyristor driving apparatus, the thyristor is a bidirectional thyristor; the first terminal is a first anode of the bidirectional thyristor; the second terminal is a trigger electrode of the bidirectional thyristor; and the third terminal is a second anode of the bidirectional thyristor.

In one embodiment of the thyristor driving apparatus, the throttling circuit includes a first transistor, a second transistor, a third transistor, and a second resistor; an output loop of the first transistor is connected in series in a trigger loop of the bidirectional thyristor; an input of the second transistor is connected in parallel, directed reverse to an input of the third transistor, to form a parallel circuit; one terminal of the parallel circuit is connected, through the second resistor, to the second anode; the other terminal of the parallel circuit is connected to the first anode; and an output of the second transistor and an output of the third transistor are connected to a control terminal of the first transistor.

In one embodiment of the thyristor driving apparatus, a collector electrode of the first transistor and an emitter electrode of the first transistor are connected in series in the trigger loop of the bidirectional thyristor; an emitter electrode of the second transistor is connected to a base electrode of the third transistor; a base electrode of the second transistor is connected to an emitter electrode of the third transistor; a collector electrode of the second transistor and a collector electrode of the third transistor are connected to a base electrode of the first transistor; the base electrode of the second transistor is connected to the first anode; and the emitter electrode of the second transistor is connected, through the second resistor, to the second anode.

In one embodiment of the thyristor driving apparatus, the first transistor is an NPN-type transistor; the second transistor and the third transistor are PNP-type transistors; and the collector electrode of the first transistor is connected to the trigger electrode.

The thyristor driving apparatus further includes a third resistor, a fifth resistor, and a sixth resistor, where two terminals of the third resistor are respectively connected to the base electrode of the first transistor and the emitter electrode of the first transistor; two terminals of the fifth resistor are respectively connected to the base electrode of the second transistor and the emitter electrode of the second transistor; and the base electrode of the first transistor is connected, via the sixth resistor, to the collector electrode of the second transistor and the collector electrode of the third transistor.

In one embodiment of the thyristor driving apparatus, the second resistor is connected in series to at least one semiconductor device.

In one embodiment of the thyristor driving apparatus, the semiconductor device is a light-emitting diode.

In one embodiment of the thyristor driving apparatus, the current-limiting element is connected to the unidirectional device; another phase of the power supply or the neutral lead backwardly charges the capacitor via the current-limiting element and the unidirectional device; a backward charging terminal of the capacitor is connected, via the first transistor, to the trigger electrode; and the other terminal of the capacitor is connected to the first anode.

The thyristor driving apparatus further includes a second semiconductor switch used to control discharging of the capacitor.

In one embodiment of the thyristor driving apparatus, the second semiconductor switch is a photoelectric coupler or a transistor circuit driven by a photoelectric coupler.

In one embodiment of the thyristor driving apparatus, the control terminal of the first transistor is connected, via an output of the second semiconductor switch, to the output of the second transistor and the output of the third transistor.

In one embodiment of the thyristor driving apparatus, a backward charging terminal of the capacitor is connected to an anode of the unidirectional device; one terminal of the current-limiting element is connected to the other terminal of the capacitor; the other terminal of the current-limiting element is connected to another phase of power supply or the neutral lead; the backward charging terminal of the capacitor is connected, via the first transistor, to the trigger electrode; a cathode of the unidirectional device is connected to the first anode; and the capacitor is connected in series to the unidirectional device to form a series circuit that is connected in parallel to the output of the second semiconductor switch.

According to the present invention, an operating power supply for a non-isolated power supply circuit is provided by using a power supply of a power grid. The non-isolated power supply circuit forms a signal trigger loop through a throttling circuit, a first terminal and a second terminal of a thyristor. A control terminal of the throttling circuit is connected to a third terminal of the thyristor. The throttling circuit detects a turn-on state of the thyristor. When the throttling circuit detects that a potential difference between the third terminal and the first terminal of the thyristor is greater than a voltage drop of which the thyristor is turned on, a trigger signal of the thyristor is applied. When the throttling circuit detects that the thyristor is turned on, the trigger signal of the thyristor is shut off. An extremely short period of time is needed to accomplish a process of triggering the thyristor. According to the present invention, the thyristor driving apparatus does not need a transformer and a high-voltage electronic switch, thereby occupying a small space, and having a simple circuit, a high cost effectiveness, a great instantaneous triggering current, a strong triggering capacity, and a low power consumption.

DETAILED DESCRIPTION

Figure 1:
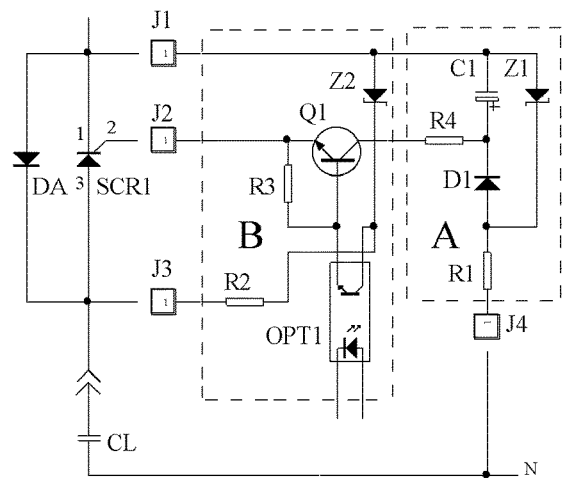
FIG. 1 is a schematic circuit diagram of a first embodiment of a thyristor driving apparatus of the present invention.

Referring to FIG. 1, a first embodiment of a thyristor driving apparatus of the present invention is shown.

The thyristor driving apparatus includes a non-isolated power supply circuit (A) and a throttling circuit (B). One terminal J1 of a power supply input of the non-isolated power supply circuit (A) is connected to a cathode of a unidirectional thyristor SCR1 (silicon controlled rectifier) to be driven (a first terminal of the thyristor). The other terminal J4 of the power supply input is connected to a neutral lead (or may also be connected to another phase of the power supply relative to the cathode of the unidirectional thyristor SCR1). The non-isolated power supply circuit (A) forms a signal trigger loop through the throttling circuit (B), a trigger electrode of the unidirectional thyristor SCR1 (a second terminal of the thyristor), and the cathode of the unidirectional thyristor SCR1. A control terminal of the throttling circuit (B) is connected to an anode of the unidirectional thyristor SCR1 (a third terminal of the thyristor). When the throttling circuit (B) detects that a potential difference (which is a forward potential difference if the thyristor is a unidirectional thyristor) between the anode of the unidirectional thyristor SCR1 and the cathode of the unidirectional thyristor SCR1 is greater than a voltage drop of which the unidirectional thyristor SCR1 is turned on, a trigger signal for the unidirectional thyristor SCR1 is applied to trigger the unidirectional thyristor SCR1 to be turned on. When the throttling circuit (B) detects the unidirectional thyristor SCR1 is turned on, the trigger signal for the unidirectional thyristor SCR1 is shut off.

The non-isolated power supply circuit (A) includes a current-limiting element R1 (a resistor), a unidirectional device D1 (a diode), a capacitor C1, a voltage regulator device Z1 (a zener diode), and a fourth resistor R4 (which can be omitted when a current-limiting element is provided in a discharge loop of the capacitor C1). The current-limiting element R1, a the-way on device D1, and the capacitor C1 are connected in series to form a first series circuit. One terminal J1 of the first series circuit is connected to the cathode of the unidirectional thyristor SCR1. The other terminal J4 of the first series circuit is connected to the neutral lead (or may also be connected to another phase of the power supply relative to the cathode of the unidirectional thyristor SCR1). The current-limiting element R1 is connected to the unidirectional device D1. The neutral lead at the terminal J4 forwardly charges the capacitor C1 via the current-limiting element R1 and the unidirectional device D1. A forward charging terminal of the capacitor C1 is connected, via the fourth resistor R4 and a first semiconductor switch Q1 of the throttling circuit (B), to the trigger electrode of the unidirectional thyristor SCR1. The other terminal of the capacitor C1 is connected to the cathode of the unidirectional thyristor SCR1. A series circuit formed by connecting the capacitor C1 and the unidirectional device D1 in series is connected in parallel to the voltage regulator device Z1 (or the capacitor C1 may also be directly connected in parallel to the voltage regulator device Z1; and the power consumption of the current-limiting element R1 can be halved, but the requirement for voltage endurance of the unidirectional device D1 is increased).

The throttling circuit (B) includes a second resistor R2, a first semiconductor switch Q1 (which is an NPN-type transistor, or can also be an NPN-type Darlington transistor or an NPN-type Darlington circuit), a third resistor R3, a second voltage regulator diode Z2, and a second semiconductor switch OPT1 (a photoelectric coupler). A control terminal (base electrode) of the first semiconductor switch Q1 is connected, via an output of the second semiconductor switch OPT1 and the second resistor R2, to an anode of the unidirectional thyristor SCR1. An anode of the second voltage regulator diode Z2 is connected to the cathode of the unidirectional thyristor SCR1. A common terminal of connection between the second resistor R2 and the second semiconductor switch OPT1 is connected to a cathode of the second voltage regulator diode Z2. Two terminals of the third resistor R3 are respectively connected to the base electrode of the first semiconductor switch Q1 and an emitter electrode of the first semiconductor switch Q1. The capacitor C1 of the non-isolated power supply circuit (A) forms a discharge loop through the fourth resistor R4 (which can be omitted when a current-limiting element is provided in the discharge loop of the capacitor C1), the first semiconductor switch Q1, the trigger electrode of the unidirectional thyristor SCR1, and the cathode of the unidirectional thyristor SCR1. A discharging current of the discharge loop is a trigger signal of the unidirectional thyristor SCR1. The first semiconductor switch Q1 herein is a transistor. A collector electrode of the transistor Q1 is used as an input for a trigger signal of the unidirectional thyristor SCR1. An emitter electrode of the transistor Q1 is connected to the trigger electrode of the unidirectional thyristor SCR1. A base electrode of the transistor Q1 is connected, via an output of the second semiconductor switch OPT1, to the second resistor R2.

The second semiconductor switch OPT1 is configured to control the capacitor C1 of the non-isolated power supply circuit (A) to discharge, and can be omitted when the discharge loop of the capacitor C1 does not need to be controlled, at which time the second voltage regulator diode Z2 also can be omitted.

Principle of Operation:

To facilitate understanding, the thyristor to which a power diode is connected in parallel, directed reverse to driving is used as an example. A unidirectional thyristor SCR1 is connected in parallel to a power diode DA. A cathode of the unidirectional thyristor SCR1 is electrified. There is a potential difference between a terminal J1 and a terminal J4. A charging current charges a capacitor C1 via a current-limiting element R1 and a unidirectional device D1. In a process of connection, when a reverse bias voltage between an anode of the unidirectional thyristor SCR1 and the cathode of the unidirectional thyristor SCR1 reaches a peak value, a control signal for turning on a second semiconductor switch OPT1 is provided. When the throttling circuit (B) detects that a forward potential difference between the anode of the unidirectional thyristor SCR1 and the cathode of the unidirectional thyristor SCR1 is greater than a voltage drop of which the unidirectional thyristor SCR1 is turned on, the first semiconductor switch Q1 is turned on. The capacitor C1 discharges via the fourth resistor R4, the first semiconductor switch Q1, the trigger electrode of the unidirectional thyristor SCR1, and the cathode of the unidirectional thyristor SCR1, to trigger surge current-free turn-on of the unidirectional thyristor SCR1. When the throttling circuit (B) detects that the unidirectional thyristor SCR1 is turned on, the first semiconductor switch Q1 is cut off. The aforementioned operation process is repeated over a next half-wave of the turn-on of the unidirectional thyristor SCR1.

Figure 2:
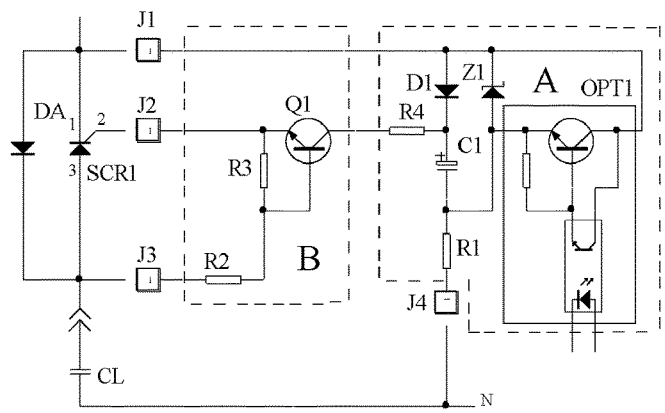
FIG. 2 is a schematic circuit diagram of a second embodiment of a thyristor driving apparatus of the present invention.

A second embodiment of a thyristor driving apparatus of the present invention is shown in FIG. 2:

The thyristor driving apparatus includes a non-isolated power supply circuit (A) and a throttling circuit (B). One terminal J1 of a power supply input of the non-isolated power supply circuit (A) is connected to a cathode of a unidirectional thyristor SCR1 to be driven (a first terminal of the thyristor). The other terminal J4 of the power supply input is connected to a neutral lead (or may also be connected to another phase of power supply relative to the cathode of the unidirectional thyristor SCR1). The non-isolated power supply circuit (A) forms a signal trigger loop through the throttling circuit (B), a trigger electrode of the unidirectional thyristor SCR1 (a second terminal of the thyristor), and the cathode of the unidirectional thyristor SCR1. A control terminal J3 of the throttling circuit (B) is connected to an anode of the unidirectional thyristor SCR1 (a third terminal of the thyristor). When the throttling circuit (B) detects that a potential difference (which is a forward potential difference if the thyristor is a unidirectional thyristor) between the anode of the unidirectional thyristor SCR1 and the cathode of the unidirectional thyristor SCR1 is greater than a voltage drop of which the unidirectional thyristor SCR1 is turned on, a trigger signal for the unidirectional thyristor SCR1 is connected to trigger the unidirectional thyristor SCR1 to be turned on. When the throttling circuit (B) detects the unidirectional thyristor SCR1 is turned on, the trigger signal for the unidirectional thyristor SCR1 is shut off.

The non-isolated power supply circuit (A) includes a current-limiting element R1 (a resistor), a unidirectional device D1 (a diode), a capacitor C1, a fourth resistor R4 (which can be omitted when a current-limiting element is provided in a discharge loop of the capacitor C1), a second semiconductor switch OPT1 (which is a transistor circuit driven by a photoelectric coupler, or may also be a photoelectric coupler when a driving current is small). The current-limiting element R1, the capacitor C1, and the unidirectional device D1 are connected in series to form a first series circuit. One terminal J1 of the first series circuit is connected to the cathode of the unidirectional thyristor SCR1. The other terminal J4 of the first series circuit is connected to the neutral lead (or may also be connected to another phase of power supply relative to the cathode of the unidirectional thyristor SCR1). The cathode of the unidirectional device D1 is connected to a forward charging terminal of the capacitor C1. One terminal of the current-limiting element R1 is connected to the other terminal of the capacitor C1. The other terminal of the current-limiting element R1 is connected to the neutral lead (or may also be connected to another phase of power supply). An anode of the unidirectional device D1 is connected to the cathode of the unidirectional thyristor SCR1. The forward charging terminal of the capacitor C1 is connected, via the fourth resistor R4 and a first semiconductor switch Q1 of the throttling circuit (B), to the trigger electrode of the unidirectional thyristor SCR1. A series circuit formed by connecting the capacitor C1 and the unidirectional device D1 in series is connected in parallel to an output of the second semiconductor switch OPT1. The series circuit formed by connecting the capacitor C1 and the unidirectional device D1 in series is connected in parallel to the voltage regulator device Z1.

The throttling circuit (B) includes a second resistor R2, a first semiconductor switch Q1 (which is an NPN-type transistor, or may also be an NPN-type Darlington transistor or an NPN-type Darlington circuit), and a third resistor R3. A control terminal (base electrode) of the first semiconductor switch Q1 is connected, through the second resistor R2, to the anode of the unidirectional thyristor SCR1. Two terminals of the third resistor R3 are respectively connected to the base electrode of the first semiconductor switch Q1 and an emitter electrode of the first semiconductor switch Q1. The capacitor C1 of the non-isolated power supply circuit (A) forms a discharge loop through the fourth resistor R4, the first semiconductor switch Q1, the trigger electrode of the unidirectional thyristor SCR1, the cathode of the unidirectional thyristor SCR1, and the second semiconductor switch OPT1 of the non-isolated power supply circuit (A). A discharging current of the discharge loop is a trigger signal of the unidirectional thyristor SCR1. The first semiconductor switch Q1 herein is a transistor. A collector electrode of the transistor Q1 is used as an input for the trigger signal of the unidirectional thyristor SCR1. An emitter electrode of the transistor Q1 is connected to the trigger electrode of the unidirectional thyristor SCR1. A base electrode of the transistor Q1 is connected to the second resistor R2.

The second semiconductor switch OPT1 is configured to control the capacitor C1 of the non-isolated power supply circuit (A) to discharge, and can be omitted when the discharge loop of the capacitor C1 does not need to be controlled and the throttling circuit (B) is placed in the position of the second semiconductor switch OPT1. It should be noted that only slight modification needs to be made to the internal circuit of the throttling circuit (B).

Principle of Operation:

To facilitate understanding, a thyristor to which a power diode is connected in parallel, directed reverse to driving is used as an example. A unidirectional thyristor SCR1 is connected in parallel to a power diode DA. A cathode of the unidirectional thyristor SCR1 is electrified. There is a potential difference between a terminal J1 and a terminal J4. A charging current charges a capacitor C1 via a current-limiting element R1 and a unidirectional device D1 until a voltage regulation value of a voltage regulator device Z1 is reached. In a process of connection, when a reverse bias voltage between an anode of the unidirectional thyristor SCR1 and the cathode of the unidirectional thyristor SCR1 reaches a peak value, a control signal for turning on a second semiconductor switch OPT1 is provided. When the throttling circuit (B) detects that a forward potential difference between the anode of the unidirectional thyristor SCR1 and the cathode of the unidirectional thyristor SCR1 is greater than a voltage drop of which the unidirectional thyristor SCR1 is turned on, the first semiconductor switch Q1 is turned on. The capacitor C1 discharges via the fourth resistor R4, the first semiconductor switch Q1, the trigger electrode of the unidirectional thyristor SCR1, the cathode of the unidirectional thyristor SCR1, and an output of the second semiconductor switch OPT1, to trigger surge current-free turn-on of the unidirectional thyristor SCR1. When the throttling circuit (B) detects that the unidirectional thyristor is turned on, the first semiconductor switch Q1 is cut off. The aforementioned operation process is repeated over a next half-wave of the turn-on of the unidirectional thyristor SCR1.

In the first embodiment and the second embodiment, the present invention can be implemented as along as a thyristor driving apparatus of the present invention is added when the power diode DA connected in parallel is changed to be a unidirectional thyristor reversely connected in parallel. The second resistor R2 can be reused. The terminal J4 is connected to another phase of power supply when a single-phase load is used.

Figure 3:
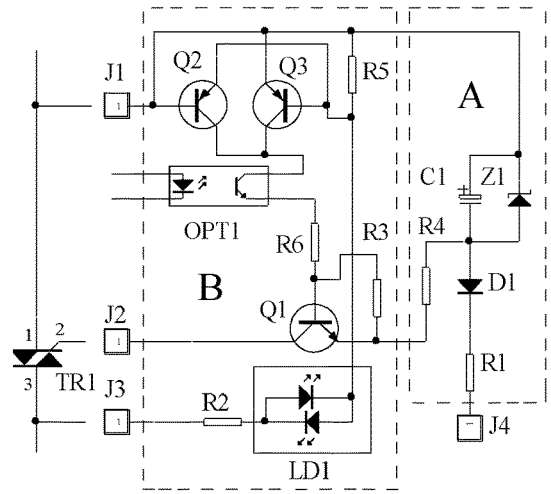
FIG. 3 is a schematic circuit diagram of a third embodiment of a thyristor driving apparatus of the present invention.

A third embodiment of a thyristor driving apparatus of the present invention is shown in FIG. 3:

The thyristor driving apparatus includes a non-isolated power supply circuit (A) and a throttling circuit (B). One terminal J1 of a power supply input of the non-isolated power supply circuit (A) is connected to a first anode of a bidirectional thyristor TR1 to be driven (a first terminal of the thyristor). The other terminal J4 of the power supply input is connected to a neutral lead (or may also be connected to another phase of power supply relative to a first anode of the bidirectional thyristor TR1). The non-isolated power supply circuit (A) forms a signal trigger loop through the throttling circuit (B), a trigger electrode of the bidirectional thyristor TR1 (a second terminal of the thyristor), and the first anode of the bidirectional thyristor TR1. A control terminal of the throttling circuit (B) is connected to a second anode of the bidirectional thyristor TR1 (a third terminal of the thyristor). When the throttling circuit (B) detects that a potential difference between the second anode of the bidirectional thyristor TR1 and the first anode of the bidirectional thyristor TR1 is greater than a voltage drop during turn-on of the bidirectional thyristor TR1, a trigger signal for the bidirectional thyristor TR1 is connected. When the throttling circuit (B) detects that the bidirectional thyristor TR1 is turned on, the trigger signal for the bidirectional thyristor TR1 is shut off.

The non-isolated power supply circuit (A) includes a current-limiting element R1 (a resistor), a unidirectional device D1 (a diode), a capacitor C1, a voltage regulator device Z1 (a voltage regulator diode), and a fourth resistor R4 (which can be omitted when a current-limiting element is provided in a discharge loop of the capacitor C1). The current-limiting element R1, the unidirectional device D1, and the capacitor C1 are connected in series to form a first series circuit. One terminal J1 of the first series circuit is connected to the first anode of the bidirectional thyristor TR1. The other terminal J4 of the first series circuit is connected to the neutral lead (or may also be connected to another phase of power supply relative to the first anode of the bidirectional thyristor TR1). The current-limiting element R1 is connected to the unidirectional device D1. The power supply connected to the terminal J4 backwardly charges the capacitor C1 via the current-limiting element R1 and the unidirectional device D1. A backward charging terminal of the capacitor C1 is connected, via the fourth resistor R4 and a first transistor Q1 of the throttling circuit (B), to the trigger electrode of the bidirectional thyristor TR1. The other terminal of the capacitor C1 is connected to the first anode of the bidirectional thyristor TR1. The capacitor C1 is connected in parallel to the voltage regulator device Z1 (or a series circuit formed by connecting the capacitor C1 and the unidirectional device D1 in series is connected in parallel to the voltage regulator device Z1; and the requirement for voltage endurance of the unidirectional device D1 is reduced, but the power consumption of the current-limiting element R1 is doubled).

The throttling circuit (B) includes a first transistor Q1 (an NPN-type transistor), a second transistor Q2 (a PNP-type transistor), a third transistor Q3 (a PNP-type transistor), a second resistor R2, a third resistor R3, a fifth resistor R5, a sixth resistor R6, a semiconductor device LD1 (a light-emitting diode), and a second semiconductor switch OPT1. An output loop of the first transistor Q1 is connected in series in a trigger loop of the bidirectional thyristor TR1. An input of the second transistor Q2 is connected in parallel, directed reverse to an input of the third transistor Q3, to form a parallel circuit. One terminal of the parallel circuit is connected, via the semiconductor device LD1 and the second resistor R2, to the second anode of the bidirectional thyristor TR1. The other terminal of the parallel circuit is connected to the first anode of the bidirectional thyristor TR1. A collector electrode (output) of the second transistor Q2 and a collector electrode (output) of the third transistor Q3 are connected, via the second semiconductor switch OPT1 and the sixth resistor R6, to a base electrode (control terminal) of the first transistor Q1. The collector electrode of the first transistor Q1 and an emitter electrode of the first transistor Q1 are connected in series in the trigger loop of the bidirectional thyristor TR1. An emitter electrode of the second transistor Q2 is connected to a base electrode of the third transistor Q3. A base electrode of the second transistor Q2 is connected to an emitter electrode of the third transistor Q3. The base electrode of the second transistor Q2 is connected to the first anode of the bidirectional thyristor TR1. The emitter electrode of the second transistor Q2 is connected, via the semiconductor device LD1 and the second resistor R2, to the second anode of the bidirectional thyristor TR1. The collector electrode of the first transistor Q1 is connected to the trigger electrode of the bidirectional thyristor TR1. Two terminals of the third resistor R3 are respectively connected to the base electrode of the first transistor Q1 and the emitter electrode of the first transistor Q1. Two terminals of the fifth resistor R5 are respectively connected to the base electrode of the second transistor Q2 and the emitter electrode of the second transistor Q2. The second semiconductor switch OPT1 is configured to control the capacitor C1 of the non-isolated power supply circuit (A) to discharge (the second semiconductor switch OPT1 can be omitted when a discharge loop of the capacitor C1 does not need to be controlled). The semiconductor device LD1 is configured to increase stability of which the throttling circuit (B) detects a potential difference between the first anode and the second anode of the bidirectional thyristor TR1. The third resistor R3 and the fifth resistor R5 are configured to increase an interference-resistant capacity of the circuit.

Principle of Operation:

A first anode of a bidirectional thyristor TR1 is electrified. There is a potential difference between a terminal J1 and a terminal J4. A charging current charges a capacitor C1 via a current-limiting element R1 and a unidirectional device D1 until a voltage regulation value of a voltage regulator device Z1 is reached. In a process of connection, when a potential difference between the first anode of the bidirectional thyristor TR1 and a second anode of the bidirectional thyristor TR1 is 0, a control signal for turning on a second semiconductor switch OPT1 is provided. When a throttling circuit (B) detects that the potential difference between the second anode of the bidirectional thyristor TR1 and the first anode of the bidirectional thyristor TR1 is greater than a voltage drop during turn-on of the bidirectional thyristor TR1, a first transistor Q1 is turned on. The capacitor C1 discharges through the first anode of the bidirectional thyristor TR1, a trigger electrode of the bidirectional thyristor TR1, the first transistor Q1, and a fourth resistor R4, to trigger surge-current-free turn-on of the bidirectional thyristor TR1. When the throttling circuit (B) detects that the bidirectional thyristor TR1 is turned on, the first transistor Q1 is cut off. The aforementioned operation process is repeated over a next half-wave of the turn-on of the bidirectional thyristor TR1.

Figure 4:
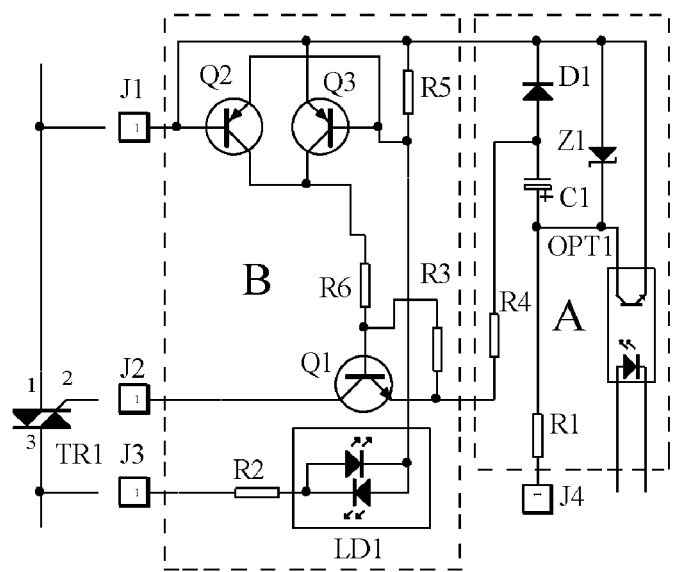
FIG. 4 is a schematic circuit diagram of a fourth embodiment of a thyristor driving apparatus of the present invention.

A fourth embodiment of a thyristor driving apparatus of the present invention is shown in FIG. 4:

The thyristor driving apparatus includes a non-isolated power supply circuit (A) and a throttling circuit (B). One terminal J1 of a power supply input of the non-isolated power supply circuit (A) is connected to a first anode of a bidirectional thyristor TR1 to be driven (a first terminal of the thyristor). The other terminal J4 of the power supply input is connected to a neutral lead (or may also be connected to another phase of power supply relative to a first anode of the bidirectional thyristor TR1). The non-isolated power supply circuit (A) forms a signal trigger loop through the throttling circuit (B), a trigger electrode of the bidirectional thyristor TR1 (a second terminal of the thyristor), and the first anode of the bidirectional thyristor TR1. A control terminal of the throttling circuit (B) is connected to a second anode of the bidirectional thyristor TR1 (a third terminal of the thyristor). When the throttling circuit (B) detects that a potential difference between the second anode of the bidirectional thyristor TR1 and the first anode of the bidirectional thyristor TR1 is greater than a voltage drop during turn-on of the bidirectional thyristor TR1, a trigger signal for the bidirectional thyristor TR1 is connected to trigger turn-on of the bidirectional thyristor TR1. When the throttling circuit (B) detects that the bidirectional thyristor TR1 is turned on, the trigger signal for the bidirectional thyristor TR1 is shut off.

The non-isolated power supply circuit (A) includes a current-limiting element R1 (a resistor), a unidirectional device D1 (a diode), a capacitor C1, a voltage regulator device Z1 (a voltage regulator diode), a fourth resistor R4 (which can be omitted when a current-limiting element is provided in a discharge loop of the capacitor C1), and a second semiconductor switch OPT1 (a photoelectric coupler). The current-limiting element R1, the unidirectional device D1, and the capacitor C1 are connected in series to form a first series circuit. One terminal J1 of the first series circuit is connected to the first anode of the bidirectional thyristor TR1. The other terminal J4 of the first series circuit is connected to the neutral lead (or may also be connected to another phase of power supply relative to the first anode of the bidirectional thyristor TR1). A backward charging terminal of the capacitor C1 is connected to an anode of the unidirectional device D1. One terminal of the current-limiting element R1 is connected to the other terminal of the capacitor C1. The other terminal J4 of the current-limiting element R1 is connected to the neutral lead (or is connected to another phase of power supply relative to the first anode of the bidirectional thyristor TR1). The backward charging terminal of the capacitor C1 is connected, via the fourth resistor R4 and a first transistor Q1 of the throttling circuit (B), to the trigger electrode of the bidirectional thyristor TR1. A cathode of the unidirectional device D1 is connected to the first anode of the bidirectional thyristor TR1. A series circuit formed by connecting the capacitor C1 and the unidirectional device D1 in series is connected in parallel to an output of the second semiconductor switch OPT1. The series circuit formed by connecting the capacitor C1 and the unidirectional device D1 in series is connected in parallel to the voltage regulator device Z1.

The second semiconductor switch OPT1 is configured to control the capacitor C1 of the non-isolated power supply circuit (A) to discharge, and can be omitted when the discharge loop of the capacitor C1 does not need to be controlled and the throttling circuit (B) is placed in the position of the second semiconductor switch OPT1. It should be noted that only slight modification needs to be made to the internal circuit of the throttling circuit (B).

The throttling circuit (B) includes a first transistor Q1 (an NPN-type transistor), a second transistor Q2 (a PNP-type transistor), a third transistor Q3 (a PNP-type transistor), a second resistor R2, a third resistor R3, a fifth resistor R5, a sixth resistor R6, and a semiconductor device LD1 (a light-emitting diode). An output loop of the first transistor Q1 is connected in series in a trigger loop of the bidirectional thyristor TR1. An input of the second transistor Q2 is connected in parallel, directed reverse to an input of the third transistor Q3, to form a parallel circuit. One terminal of the parallel circuit is connected, via the semiconductor device LD1 and the second resistor R2, to the second anode of the bidirectional thyristor TR1. The other terminal of the parallel circuit is connected to the first anode of the bidirectional thyristor TR1. A collector electrode (output) of the second transistor Q2 and a collector electrode (output) of the third transistor Q3 are connected, via the sixth resistor R6, to a base electrode (control terminal) of the first transistor Q1. The collector electrode of the first transistor Q1 and an emitter electrode of the first transistor Q1 are connected in series in the trigger loop of the bidirectional thyristor TR1. An emitter electrode of the second transistor Q2 is connected to a base electrode of the third transistor Q3. A base electrode of the second transistor Q2 is connected to an emitter electrode of the third transistor Q3. The base electrode of the second transistor Q2 is connected to the first anode. The emitter electrode of the second transistor Q2 is connected, via the semiconductor device LD1 and the second resistor R2, to the second anode of the bidirectional thyristor TR1. The collector electrode of the first transistor Q1 is connected to the trigger electrode of the bidirectional thyristor TR1. Two terminals of the third resistor R3 are respectively connected to the base electrode of the first transistor Q1 and the emitter electrode of the first transistor Q1. Two terminals of the fifth resistor R5 are respectively connected to the base electrode of the second transistor Q2 and the emitter electrode of the second transistor Q2. The semiconductor device LD1 is configured to increase stability of which the throttling circuit detects a potential difference between the first anode and the second anode of the bidirectional thyristor TR1. The third resistor R3 and the fifth resistor R5 are configured to increase an interference-resistant capacity of the circuit.

Principle of Operation:

A first anode of a bidirectional thyristor TR1 is electrified. There is a potential difference between a terminal J1 and a terminal J4. A charging current charges a capacitor C1 via a current-limiting element R1 and a unidirectional device D1 until a voltage regulation value of a voltage regulator device Z1 is reached. In a process of operation connection, when a potential difference between the first anode of the bidirectional thyristor TR1 and a second anode of the bidirectional thyristor TR1 is 0, a control signal for turning on a second semiconductor switch OPT1 is provided. When a throttling circuit (B) detects that the potential difference between the second anode of the bidirectional thyristor TR1 and the first anode of the bidirectional thyristor TR1 is greater than a voltage drop during turn-on of the bidirectional thyristor TR1, a first transistor Q1 is turned on. The capacitor C1 discharges through the second semiconductor switch OPT1, the first anode of the bidirectional thyristor TR1, a trigger electrode of the bidirectional thyristor TR1, the first transistor Q1, and a fourth resistor R4, to trigger surge-current-free turn-on of the bidirectional thyristor TR1. When the throttling circuit (B) detects that the bidirectional thyristor TR1 is turned on, the first transistor Q1 is cut off. The aforementioned operation process is repeated over a next half-wave of the turn-on of the bidirectional thyristor TR1.

In the foregoing embodiments, the voltage regulation value of the voltage regulator device Z1 may be set at approximately 20 V. A capacitor value of the capacitor may be set to be about several microfarads. The discharging current of the capacitor is sufficient enough to satisfy the instantaneous triggering current of the thyristor. The current-limiting element R1 may adopt a resistor. The current of the current-limiting element R1 may be far smaller than the minimum triggering current (generally a reliable triggering current for triggering turn-on of a thyristor of several dozens of A is several dozens of mA) needed for triggering turn-on of the thyristor (a unidirectional thyristor or a bidirectional thyristor). A resistance value of the current-limiting element R1 may be relatively large, and the operating current may be set within one mA (which is sufficient enough to drive a thyristor of several dozens of A). Even if 1 mA is used for calculation, when the operating voltage is 380 V, the power consumption of the current-limiting element R1 is only 0.38 W; and when the operating voltage is 220 V, the power consumption of the current-limiting element R1 is only 0.22 W. The current-limiting element R1 may also be a capacitor, or a series circuit of a resistor and a capacitor, instead. The principle of operation is identical, and also falls within the scope of protection of the present patent.

Figure 5:
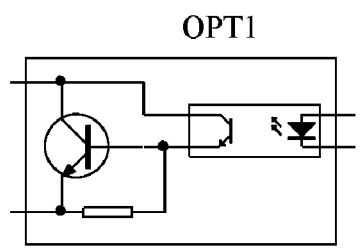
FIG. 5 shows a transistor circuit driven by a photoelectric coupler.

Either the photoelectric coupler or the transistor circuit driven by a photoelectric coupler (see FIG. 5) used in the aforementioned embodiments may be selected according to needs.

During use in a single-phase alternating-current system, a power supply that is connected to the thyristor driving apparatus of the present invention and at another end relative to a first terminal of a thyristor (that is, the main loop end of the thyristor) is also defined at a neutral lead. During use in a three-phase power system, a first thyristor driving apparatus of the present invention may be connected, via a second thyristor driving apparatus at another phase, to another phase of power supply relative to the first thyristor driving apparatus of the present invention.

In view of the forgoing, the thyristor driving apparatus of the present invention has at least the following advantages:

1. A trigger signal of the thyristor is directly provided by a current-limiting element of an alternating-current power grid, neither a transformer nor a high-voltage electronic switch is needed, thereby having a high reliability, a simple circuit, and a high cost effectiveness, and occupying a small space.

2. By using a capacitance energy storage trigger mode, a throttling circuit detects a turn-on state of the thyristor and immediately cut off discharging of the capacitor when detecting that the thyristor is turned on. Only an extremely short period of time is needed to accomplish the process of triggering the thyristor. The present invention has features of a great instantaneous output current and a strong triggering capacity. Meanwhile, the operating current of the current-limiting element is far smaller than the minimum triggering current for triggering turn-on of the thyristor, and the operating power consumption is low.

What is claimed is:

1. A thyristor driving apparatus, comprising:
a non-isolated power supply circuit; and
a throttling circuit,
wherein one terminal of a power supply input of the non-isolated power supply circuit is connected to a first terminal of a thyristor to be driven, and another terminal of the power supply input is connected to another phase of the power supply relative to the first terminal of the thyristor or a neutral lead;
wherein the non-isolated power supply circuit is connected to the throttling circuit, a second terminal of the thyristor and the first terminal of the thyristor; and
wherein a control terminal of the throttling circuit is connected to a third terminal of the thyristor; and
wherein the non-isolated power supply circuit comprises a current-limiting element, a unidirectional device, a capacitor and a voltage regulator device, wherein the current-limiting element, the unidirectional device and the capacitor are connected in series to form a first series circuit, wherein one terminal of the first series circuit is connected to the first terminal, and another terminal of the first series circuit is connected to another phase of the power supply or the neutral lead, and wherein the capacitor is connected in parallel to the voltage regulator device, or the capacitor is connected in series to the unidirectional device to form a series circuit that is connected in parallel to the voltage regulator device.

2. The thyristor driving apparatus according to claim 1, wherein when the throttling circuit detects that a potential difference between the third terminal and the first terminal of the thyristor is greater than a voltage drop of which the thyristor is turned on, a trigger signal of the thyristor is applied, and when the throttling circuit detects that the thyristor is turned on, the trigger signal is shut off.

3. The thyristor driving apparatus according to claim 1, wherein the throttling circuit comprising:
at least a semiconductor device; and
at least a current-limited element.

4. The thyristor driving apparatus according to claim 1, wherein a current of the current-limiting element is smaller than a minimum trigger current needed for triggering the thyristor to be turned on.

5. The thyristor driving apparatus according to claim 1, wherein the voltage regulator device is a voltage regulator diode, the unidirectional device is a diode, and the current-limiting element is a resistor.

6. The thyristor driving apparatus according to claim 1, further comprising a fourth resistor, wherein the fourth resistor is connected in series in a discharge loop of the capacitor.

7. The thyristor driving apparatus according to claim 1, wherein a discharge loop is formed of the capacitor through the throttling circuit and the second terminal and the first terminal of the thyristor.

8. The thyristor driving apparatus according to claim 1, wherein the thyristor is a unidirectional thyristor, wherein the first terminal is a cathode of the unidirectional thyristor, the second terminal is a trigger electrode of the unidirectional thyristor, and the third terminal is an anode of the unidirectional thyristor, wherein the throttling circuit comprises a second resistor and a first semiconductor switch, wherein a control terminal of the first semiconductor switch is connected, through the second resistor, to the anode of the unidirectional thyristor, and wherein a discharge loop is formed of the capacitor through the first semiconductor switch, the trigger electrode and the cathode of the unidirectional thyristor.

9. The thyristor driving apparatus according to claim 8, wherein when the throttling circuit detects that a forward potential difference between the anode of the unidirectional thyristor and the cathode of the unidirectional thyristor is greater than a voltage drop of which the unidirectional thyristor is turned on, the first semiconductor switch is turned on, and when the throttling circuit detects that the unidirectional thyristor is turned on, the first semiconductor switch is turned off.

10. The thyristor driving apparatus according to claim 8, wherein the first semiconductor switch is an NPN-type transistor, or an NPN-type Darlington transistor, or an NPN-type Darlington circuit.

11. The thyristor driving apparatus according to claim 10, further comprising a third resistor, wherein a collector electrode of the transistor is used as an input for a trigger signal of the unidirectional thyristor, an emitter electrode of the transistor is connected to the trigger electrode, a base electrode of the transistor is connected to the second resistor; and two terminals of the third resistor are respectively connected to the emitter electrode of the transistor and the base electrode of the transistor.

12. The thyristor driving apparatus according to claim 8, wherein the current-limiting element is connected to the unidirectional device; another phase of the power supply or the neutral lead forwardly charges the capacitor via the current-limiting element and the unidirectional device, wherein a forward charging terminal of the capacitor is connected, via the first semiconductor switch, to the trigger electrode; and the other terminal of the capacitor is connected to the cathode of the unidirectional thyristor.

13. The thyristor driving apparatus according to claim 8, further comprising a second semiconductor switch used to control discharging of the capacitor.

14. The thyristor driving apparatus according to claim 13, wherein the second semiconductor switch is a photoelectric coupler or a photoelectric coupler driving transistor circuit.

15. The thyristor driving apparatus according to claim 13, wherein a cathode of the unidirectional device is connected to a forward charging terminal of the capacitor, an anode of the unidirectional device is connected to the cathode of the unidirectional thyristor, one terminal of the current-limiting element is connected to the other terminal of the capacitor, wherein the other terminal of the current-limiting element is connected to another phase of power supply or the neutral lead, wherein the forward charging terminal of the capacitor is connected, via the first semiconductor switch, to the trigger electrode and wherein the capacitor is connected in series to the unidirectional device to form a series circuit that is connected in parallel to an output of the second semiconductor switch.

16. The thyristor driving apparatus according to claim 13, wherein an output of the second semiconductor switch is connected to the control terminal of the first semiconductor switch.

17. The thyristor driving apparatus according to claim 16, further comprising a second voltage regulator diode, wherein the second resistor is connected, via the output of the second semiconductor switch, to the control terminal of the first semiconductor switch; an anode of the second voltage regulator diode is connected to the cathode of the unidirectional thyristor; and a common terminal of connection between the second resistor and the second semiconductor switch is connected to a cathode of the second voltage regulator diode.

18. The thyristor driving apparatus according to claim 1, wherein the thyristor is a bidirectional thyristor, wherein the first terminal is a first anode of the bidirectional thyristor; the second terminal is a trigger electrode of the bidirectional thyristor; and the third terminal is a second anode of the bidirectional thyristor.

19. The thyristor driving apparatus according to claim 18, wherein the throttling circuit comprises a first transistor, a second transistor, a third transistor, and a second resistor, an output loop of the first transistor is connected in series in a trigger loop of the bidirectional thyristor, an input of the second transistor is connected in parallel, directed reverse to an input of the third transistor, to form a parallel circuit; one terminal of the parallel circuit is connected, through the second resistor, to the second anode, the other terminal of the parallel circuit is connected to the first anode; and an output of the second transistor and an output of the third transistor are connected to a control terminal of the first transistor.

20. The thyristor driving apparatus according to claim 19, wherein a collector electrode of the first transistor and an emitter electrode of the first transistor are connected in series in the trigger loop of the bidirectional thyristor, an emitter electrode of the second transistor is connected to a base electrode of the third transistor, a base electrode of the second transistor is connected to an emitter electrode of the third transistor, a collector electrode of the second transistor and a collector electrode of the third transistor are connected to a base electrode of the first transistor, the base electrode of the second transistor is connected to the first anode, and the emitter electrode of the second transistor is connected, through the second resistor, to the second anode.

21. The thyristor driving apparatus according to claim 20, wherein the first transistor is an NPN-type transistor, the second transistor and the third transistor are PNP-type transistors, and the collector electrode of the first transistor is connected to the trigger electrode.

22. The thyristor driving apparatus according to claim 21, further comprising a third resistor, a fifth resistor, and a sixth resistor, wherein two terminals of the third resistor are respectively connected to the base electrode of the first transistor and the emitter electrode of the first transistor, two terminals of the fifth resistor are respectively connected to the base electrode of the second transistor and the emitter electrode of the second transistor, and the base electrode of the first transistor is connected, via the sixth resistor, to the collector electrode of the second transistor and the collector electrode of the third transistor.

23. The thyristor driving apparatus according to claim 21, wherein the second resistor is connected in series to at least one semiconductor device.

24. The thyristor driving apparatus according to claim 23, wherein the semiconductor device is a light-emitting diode.

25. The thyristor driving apparatus according to claim 19, wherein the current-limiting element is connected to the unidirectional device, another phase of the power supply or the neutral lead backwardly charges the capacitor via the current-limiting element and the unidirectional device, a backward charging terminal of the capacitor is connected, via the first transistor, to the trigger electrode, and the other terminal of the capacitor is connected to the first anode.

26. The thyristor driving apparatus according to claim 19, further comprising a second semiconductor switch used to control discharging of the capacitor.

27. The thyristor driving apparatus according to claim 26, wherein the second semiconductor switch is a photoelectric coupler or a transistor circuit driven by a photoelectric coupler.

28. The thyristor driving apparatus according to claim 26, wherein the control terminal of the first transistor is connected, via an output of the second semiconductor switch, to the output of the second transistor and the output of the third transistor.

29. The thyristor driving apparatus according to claim 26, wherein a backward charging terminal of the capacitor is connected to an anode of the unidirectional device, one terminal of the current-limiting element is connected to the other terminal of the capacitor, the other terminal of the current-limiting element is connected to another phase of power supply or the neutral lead, the backward charging terminal of the capacitor is connected, via the first transistor, to the trigger electrode, a cathode of the unidirectional device is connected to the first anode, and the capacitor is connected in series to the unidirectional device to form a series circuit that is connected in parallel to the output of the second semiconductor switch.

* * * * *